US008773169B2

(12) United States Patent
Dinc et al.

(10) Patent No.: US 8,773,169 B2
(45) Date of Patent: Jul. 8, 2014

(54) HIGH FREQUENCY SIGNAL COMPARATOR FOR SHA-LESS ANALOG-TO-DIGITAL CONVERTERS

(75) Inventors: Huseyin Dinc, Greensboro, NC (US); Michael Elliot, Summerfield, NC (US); William Thomas Boles, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 141 days.

(21) Appl. No.: 12/910,662

(22) Filed: Oct. 22, 2010

(65) Prior Publication Data

US 2012/0098690 A1    Apr. 26, 2012

(51) Int. Cl.
*H03K 5/22* (2006.01)
(52) U.S. Cl.
USPC .............................. 327/65; 327/67
(58) Field of Classification Search
USPC ......................... 327/63, 65, 67, 77
See application file for complete search history.

(56) References Cited

U.S. PATENT DOCUMENTS

| | | | | |
|---|---|---|---|---|
| 5,332,931 A * | 7/1994 | Crispie et al. | ................... | 327/67 |
| 5,905,290 A * | 5/1999 | Houston | ....................... | 257/380 |
| 5,959,469 A * | 9/1999 | Kurauchi et al. | ............... | 327/77 |
| 6,624,667 B2 * | 9/2003 | Nii | ................................... | 327/77 |
| 7,395,464 B2 * | 7/2008 | Vancura | ........................ | 714/718 |
| 2002/0186052 A1 * | 12/2002 | Shih et al. | ........................ | 327/65 |
| 2009/0289827 A1 | 11/2009 | Elliott et al. | | |
| 2010/0237908 A1 * | 9/2010 | Chatal | ............................. | 327/94 |

OTHER PUBLICATIONS

Analog Devices Inc., "Quad IF Receiver," AD6657 Datasheet, Rev. A, Jul. 2010, 32 pages.

* cited by examiner

*Primary Examiner* — Quan Tra
(74) *Attorney, Agent, or Firm* — Kenyon & Kenyon, LLP

(57) ABSTRACT

A high frequency input signal comparator for optimizing group delay, reducing input frequency dependent offset and an offset auto-zeroing latch core are described. The comparator may include an isolation switch stage, and a latch core. The isolation switch stage may isolate latch core depending upon a control signal, thereby reducing input frequency dependent offset. The latch core may include a pair of inverters cross coupled via an impedance to one another. The latch core may include latch switches selected to attain a certain gain across the individual inverters comprising the latch core while resetting the latch core. The gain across the individual inverters during the acquire/reset phase may bootstrap the coupling impedances, thereby reducing loading and group delay at the input of the latch core. The coupling impedances may be designed to minimize or auto-zero statistical offset, thereby minimize input referred offset.

25 Claims, 6 Drawing Sheets

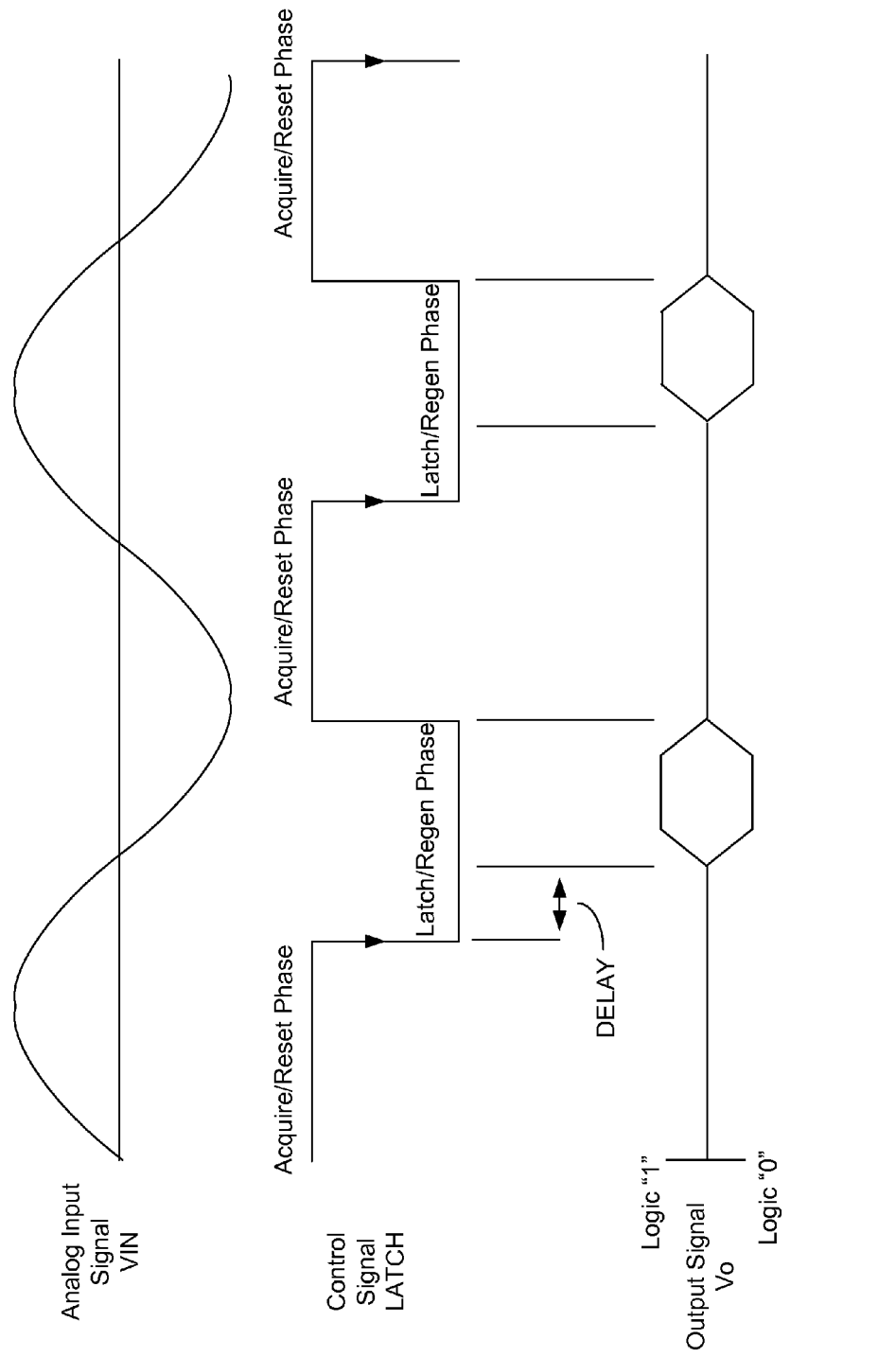

300

400

500

HIGH FREQUENCY SIGNAL COMPARATOR FOR SHA-LESS ANALOG-TO-DIGITAL CONVERTERS

BACKGROUND

The present invention relates to a comparator that allows for high frequency analog signal comparison. In particular, the exemplary embodiments relate to eliminating the input frequency dependent and statistical offsets that affect the trigger point, response time of the comparator and group delay of the comparator.

The purpose of an analog-to-digital converter (ADC) is to convert an analog signal into a digital representation of the analog signal. One of the building blocks of an ADC is a comparator that compares an input signal to a reference signal. An ADC may have a dedicated front-end sample and hold amplifier (SHA) to alleviate the timing requirements in the front-end that have to be met while processing, especially, high input frequencies. For example, in a pipelined ADC, a first stage may include a multiplying-digital-to-analog-converter (MDAC1) and a first-stage sub-ADC, which is typically a flash ADC (Flash1). The MDAC1 and Flash1 must have a certain clock and analog input signal skew limits. The clock and the skew limits allow the ADC to sustain certain target performance at the high input frequencies. However, a dedicated front-end SHA increases power consumption, noise, and chip area. Therefore, avoiding a front-end SHA can be advantageous to reduce power consumption, noise and die cost. The present embodiments also mitigate the design challenges related to matching the Flash1 group delay to MDAC1 group delay.

FIG. 1 illustrates a conventional comparator. The comparator 100 includes a pre-amplifier stage 110 and a latch stage 120. The pre-amplifier stage 110 is an operational transconductance amplifier (OTA) that receives a differential input voltage signal VIN, and generates a differential output current. The latch stage 120 includes a pair of inverters connected in parallel, but in opposite polarity to one another (cross-coupled) and a reset switch 125 is also connected in parallel the inverters at the output of the comparator 100.

The comparator 100 has two distinct operating phases based on the state of the latch switch; acquire/reset phase and a latch/regeneration phase. The comparator is in the acquire/reset phase when the latch switch is closed, and it is in the latch/regeneration phase when the reset switch is opened. In operation, the differential input voltage signal VIN applied to the differential inputs of the pre-amplifier stage 110 is converted to differential currents. The generated differential currents are proportional to the difference of the applied differential VIN voltages. The differential currents are provided to the latch stage 120. The pair of inverters 121 and 122 responds to the provided differential currents, and output a voltage equivalent of either logic "1" or "0" when the reset switch is turned off. During the latch phase, when the reset switch is open, the output, Vout, is a digital representation of the polarity of the input signal at the instant the reset switch is opened. The arrangement of the inverters 121 and 122 serves to maintain the state, or output voltage, at a particular value until the latch is reset. To reset the latch stage 120, the reset latch switch 125 is closed to short the inputs to the outputs of the inverters 121 and 122, and the latch 120 is brought to its trip point. When the latch is reset, it is kept at its trip point and it is ready to respond to the differential signal provided by the preamplifier. As soon as the reset switch opens, the latch starts to regenerate and produce a digital representation of the polarity of the input signal. However, the regeneration is not instantaneous. In other words, the latch cannot produce a digital representation of the polarity of the input signal instantaneously. Consequently, while the latch 120 is trying to produce a digital representation, the preamplifier 110 continues to supply a signal proportional to the input signal to the latch. Since the input signal continues to influence the latch 120 during the latch phase (when the latch switch is open), if the input signal changes substantially before the latch can produce a valid digital output, the input signal can influence the latch's decision. Therefore, a fast changing input can alter the trip point of the comparator. This results in an input-frequency-dependent trip point or offset of the latch.

One way to compensate for the input-frequency dependency of the trip point is to isolate the latch circuit 120 from the preamplifier 110 during the latch/regeneration phase. This can be done with isolation switches. By using isolation switches, the input cannot influence the latch core during the latch/regeneration phase, and the latch's decision is not altered by the input during the latch/regeneration phase. The latch's decision is based on the input value at the time the latch switch opens (or turns off). However, the introduction of isolation switches between the preamplifier 110 and the latch 120 core worsens another type of offset, called statistical offset. Statistical offset is a result of random shifts in device parameters during fabrication. Appropriately sizing the devices and maximizing the voltage gain of the preamplifier reduces the input referred statistical offset. However, the reduction in statistical offset may not be adequate, or the device sizes may have to be optimized to meet other design specifications.

There is a need for a comparator design suitable for comparing high frequency input signals that does not have a large amount of offset group delay, and has a fast response time. The inventor recognized a solution to the above problems as illustrated in the following embodiments.

BRIEF DESCRIPTION OF THE DRAWINGS

FIG. 2A illustrates an exemplary timing diagram for sampling an input signal by the embodiment illustrated in FIG. 2 according to an embodiment of the present invention.

DETAILED DESCRIPTION

Figure 1:
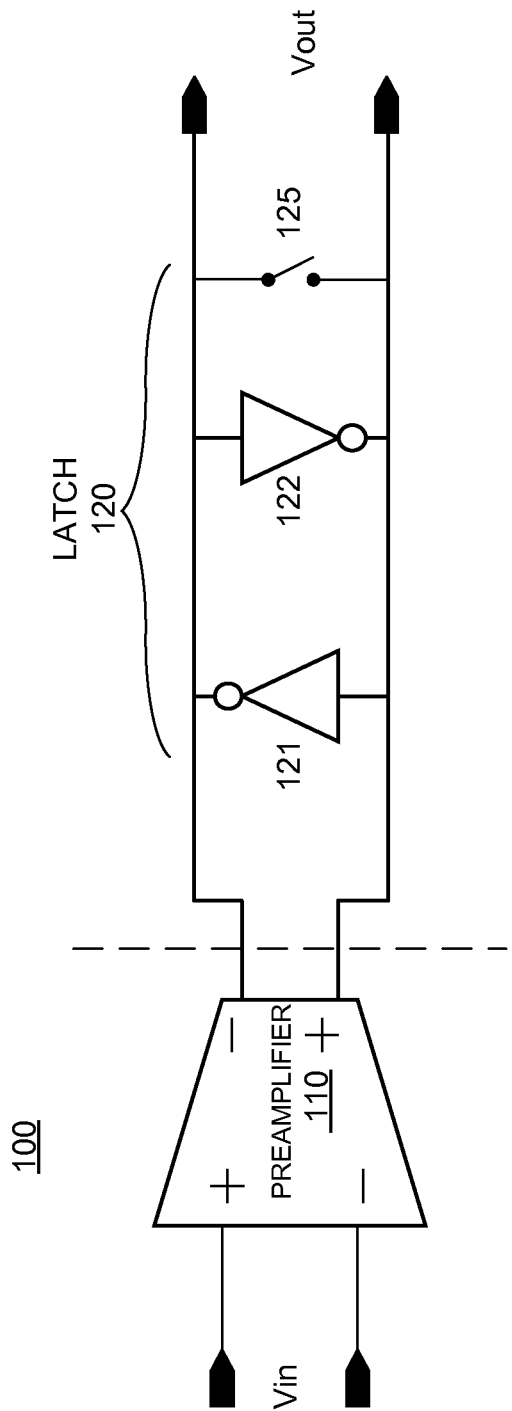
FIG. 1 illustrates a conventional latched comparator.

Embodiments of the present invention may provide a low-offset, high frequency signal comparator that mitigates the group-delay matching challenges when used in a SHA-less ADC. The comparator may include a pre-amplifier stage, an isolation switch stage, and a latch core. The pre-amplifier stage may have inputs for differential inputs and outputs for outputting differential outputs to respective inputs of the isolation switch stage. The isolation switch stage may provide the differential signals to respective inputs of the latch core depending upon a control signal input to the isolation switch stage. The latch core may include a pair of inverters cross coupled to one another via a pair of impedances. An input of a first of the pair of inverters may be connected to a first output of the comparator, and may be connected to a first terminal of a first impedance. A second terminal of the first impedance may be connected to an input of a second of the pair of inverters. An input of a second of the pair inverters may be connected to a second output of the comparator, and may be connected to a first terminal of a second impedance. A second terminal of the second impedance is connected to an input of the first of the pair of inverters. The latch core of the comparator may also include latch switches configured to short circuit the input to the output of each respective inverter. The outputs of the latch core may provide a digital representation of the input.

Another embodiment may provide a low-offset, high-frequency signal comparator with improved regeneration time constant and sensitivity that mitigates the group delay matching challenges when used in a SHA-less ADC. The comparator may include a pre-amplifier stage, an isolation switch stage, load resistors, a first latch core, a second latch core and a final latch switch. The pre-amplifier stage may have inputs for input signals and outputs for outputting output signals to respective inputs of the isolation switch stage. The isolation switch stage may provide the inputted signals to respective inputs of the first latch core depending upon a control signal input to the isolation switch stage. The first latch core may include a pair of inverters cross coupled to one another via a pair of impedances. An input of a first of the pair of inverters may be connected to a first output of the comparator, and connected to a first terminal of a first impedance. A second terminal of the first impedances may be connected to an input of a second of the pair of inverters. An input of a second of the pair inverters may be connected to a second output of the comparator, and connected to a first terminal of a second impedance. A second terminal of the second impedance may be connected to an input of the first of the pair of inverters. The first latch core of the comparator may also include a latch switch configured to short circuit the input to the output of each respective inverter. The outputs of the first latch core may connect to respective load (or coupling) resistors that connect to inputs of the second latch core. The second latch core may include a first inverter having an output connected to a first of the inputs to the second latch core and an input connected to a second of the inputs of the second latch core. The final latch switch may be connected across the outputs and, when actuated, short circuits one of the outputs to the other output. The outputs of the second latch core may provide a digital representation of the input.

Figure 2:
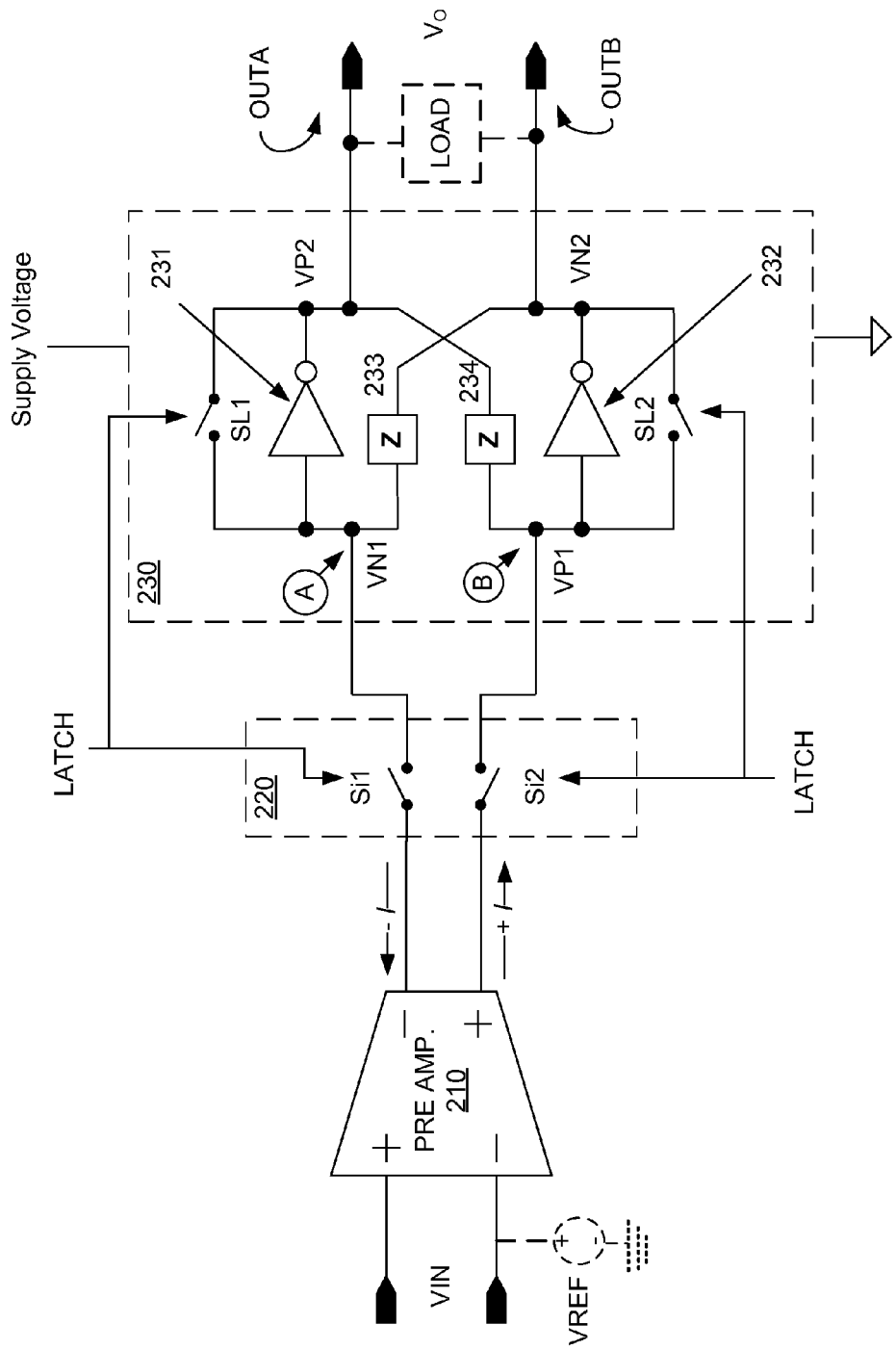
FIG. 2 illustrates a simplified schematic of a comparator according to an embodiment of the present invention.

FIG. 2 illustrates a simplified schematic of a high-frequency-signal comparator 200 according to an embodiment of the present invention. The comparator 200 may include comparator inputs, a pre-amplifier stage 210, an isolation switch stage 220, a latch core 230 and comparator outputs. The comparator 200 may receive an input signal VIN that may be a differential signal. Alternatively, the input voltage signal may be referenced to a reference voltage signal or ground. For the following explanation, the input signal VIN may be considered a differential signal. The pre-amplifier stage 210 may comprise an operational transconductance amplifier (OTA), which may generate a current in response to the application of an input voltage. The generated current may be proportional to the difference of the differential voltages and may be amplified. The generated current may also be a differential current in which the magnitude of the current is substantially the same, but the polarity may be different. For example, a first current having a value −I may be output from the inverting output of the pre-amplifier stage 210, and a second current having a value +I may be output from the non-inverting output of the pre-amplifier stage 210. The differential outputs of the pre-amplifier stage 210 may connect to the isolation switch stage 220.

The isolation switch stage 220 may include isolation switches Si1 and Si2 that may act to isolate the latch core 230 from the pre-amplifier stage 210. The isolation switches Si1 and Si2 may be voltage or current switches. The isolation switches Si1 and Si2 may be transistors that may be actuated in response to a control signal, e.g., a latch signal. The outputs of the isolation switch stage 220 may connect to the input of the latch core 230.

The latch core 230 may include inverters 231, 232, switches SL1 and SL2 and impedances 233, 234. For example, the switches SL1 and SL2 may be selected to have a particular switch resistance when closed. The inverters 231 and 232 may be connected between respective inputs and outputs of the latch core 230. The inverter 231 may have an input connected via the isolation switch Si1 to the inverting output of the pre-amplifier stage 210 and an output connected to the output terminal OUTA of the latch core 230. Switch SL1 may be connected in parallel with inverter 231 along the signal path −I. The inverter 232 may have an input connected via isolation switch Si2 to the non-inverting output of the pre-amplifier stage 210 and an output connected to the output of the latch core 230. Switch SL2 may be connected in parallel with inverter 232 along the signal path +I. The inverters 231 and 232 may be cross-coupled meaning that an input of a first inverter is connected to the output of a second inverter, maybe through an impedance Z, such as a resistor or a capacitor, and vice versa. For example in FIG. 2, the inverter 231 may have an impedance 233, such as a capacitor, connected to the input of the inverter 231 and to the output of inverter 232. Similarly, the impedance 234, which may also be a capacitor, may be connected to the input of the inverter 232 and the output of the inverter 231. Alternatively, both impedances 233, 234 may be resistors or transistors. The operation of the switches SL1 and SL2 may be controlled by a common control signal LATCH, and when actuated may provide a feedback loop around the inverters 231 and 232, respectively. This feedback loop may be exploited to substantially reduce (i.e., auto-zero) the offset of the corresponding inverters. Therefore, the latch's offset may be auto-zeroed. A first output of the latch core 230 may respectively be connected at the junction of a terminal of switch SL1, the output of the inverter 231 and a terminal of impedance 234. Likewise, a second output of the latch core 230 may be at the junction of a terminal of switch SL2, the output of the inverter 232 and a terminal of impedance 233. The latch core 230 may provide the output voltage Vo to the comparator outputs.

An input signal VIN may be applied to a non-inverting input and an inverting input of the pre-amplifier stage 210. The input signal VIN may be a differential signal where an input voltage having a first polarity is applied to the non-inverting input of the pre-amplifier stage 210 and the same input voltage, but having a second, opposite polarity is applied to the inverting input of the pre-amplifier stage 210. Alternatively, in a single ended implementation, a reference voltage VREF (shown in phantom) may be applied to one of the inputs. The pre-amplifier stage 210 may generate a current proportional to the difference between the input voltages applied to the inputs of the pre-amplifier stage 210. The generated current may be output from the pre-amplifier stage 210 as a differential current to the isolation switch stage 220. For example, a negative current −I may be output from the inverting output of the pre-amplifier stage 210 and a positive current +I may be output from the non-inverting input of the pre-amplifier stage 210. The isolation switch stage 220 may pass the signal to the latch core 230. Since the inverters 231, 232 and switches SL1 and SL2 are comprised of electronic components, such as transistors, they have an effective impedance associated with them. This associated impedance (input impedance of the latch core 230) and the current provided by the pre-amplifier stage 210 may result in a voltage being generated at the inputs of the latch core 230. For example, the negative current −I may generate a negative input voltage VN1, and the positive current +I may generate a positive input voltage VP1.

The comparator 200 can operate according to a control signal in two phases: an acquire/reset phase and a latch/regeneration phase. An exemplary timing diagram of FIG. 2A shows exemplary analog input signal, control signal and output signals. The analog input signal VIN may be a sinusoidal input signal having a particular frequency and magnitude. This is the signal applied to the inputs of the comparator 200. In the acquire/reset phase, the control signal LATCH may be high, in which case, the isolation switches Si1 and Si2 and latch switches SL1 and SL2 may be closed. In the acquire/reset phase, voltages VN1 and VP1, which may be scaled representations of the differential input signal VIN, may be present at nodes A and B, respectively. The inverters 231 and 232 may be amplifiers that by themselves may have a gain greater than 1. However, the configuration of the latch switches SL1 and SL2 create a feedback path on each inverter 231 and 232 that has been designed using the resistance of switches SL1 and SL2 to create an amplifier circuit having approximately a negative unity gain. As explained above, with the latch switches SL1 and SL2 closed, the voltages VP2 and VN2 have substantially the same magnitude as voltages VN1 and VP1, but have opposite polarity. With the LATCH control signal high, the input voltage is acquired, and voltages at the inputs and the outputs of the latch core 230 are roughly the same, in other words, the latch core 230 is reset. During the acquire/reset phase, because of the feedback around inverters 231 and 232 through latch switches SL1 and SL2 respectively, the inverters sample their statistical offset at their gates. (For example, the offset sampling instant may be when the latch switches SL1 and SL2 turn off, which, in this case, may be at the falling edge of the LATCH control signal. Of course, the latch switches SL1 and SL2 may turn off at other instances than the falling edge of the LATCH signal.) In other words, the latch core 230 substantially auto-zeroes its statistical offset. Therefore, the input referred statistical offset due to the latch core 230 is approximately zero. If the impedances 233 and 234 are impedances other than capacitors, the latch core 230 may partially auto-zero its statistical offset or the statistical offset may be reduced because of the isolation between the inverters 231 and 232 provided by the impedances 233 and 234.

After the control signal LATCH falls, the switches SL1, SL2, Si1 and Si2 open, and the negative feedback paths through SL1 and SL2 from the outputs of the respective inverters 231 and 232 that kept the gain of the inverters at a negative unity gain are no longer conducting. Since one of the input signals VN1 or VP1 will be greater (i.e., much more negative or much more positive) than the other, the inverters 231 and 232 start regenerating and produce (with some delay required for regeneration) an output signal Vo that is a digital voltage representation of the input signal value VIN that was acquired at the end of the acquisition portion of the acquire/reset phase (the instant the latch signal falls). The output signal Vo is either a voltage representing a logic "1" or a logic "0." For example, input voltage VP1 may be greater than input voltage VN1, in which case, output OUTA may be approximately equal to the supply voltage to the latch core 230, and output OUTB may be approximately zero (ground), in which case a logic "1" may be output. Conversely, voltage VN1 may be less than voltage VP1, in which case, output OUTA may be approximately equal to zero, and output OUTB may be approximately equal to the supply voltage, in which case a logic "0" may be output.

In more detail, the voltage VN1 at Node A may be a negative voltage and the voltage VP1 at Node B may be a positive voltage when referenced to a common voltage level, both having a similar magnitude. By selecting the size of the transistor forming latch switch SL1 so that it has a particular resistance, the transistors that form inverter 231 may, in combination with the resistance of the latch switch SL1, create an amplifier having a negative unity gain (−1). In which case, the output voltage VP2 may have substantially the same voltage as VN1, but opposite polarity. Since the inverter 232 is arranged in a manner similar to inverter 231, inverter 232 also may have substantially a negative unity gain (−1). As a result, the voltages VP1 and VN2 may be substantially the same value, but opposite polarity.

Because of the negative unit gain condition explained above, VN1 is roughly equal to VN2. Likewise, VP1 is roughly equal to VP2. Therefore, the impedances 233 and 234 are effectively bootstrapped, i.e. the impedances 233 and 234 do not load the input of the latch core input nodes (node A and B). The impedances 233 and 234 may be capacitors. In this case, the latch core 230 may auto-zero its statistical offset during reset phase. However, the impedances 233 and 234 may load the input of the latch core 230 (and effectively, the output of preamplifier 210) and increase the group delay at these nodes. This increase in the group delay, however, makes the group delay matching requirements between the Flash1 and MDAC 1 in a SHA-less pipelined ADC difficult to meet. As explained earlier, sizing SL1 and SL2 such that the inverters 231 and 232 have a negative unity gain to bootstrap the capacitors (impedances 233 and 234) (i.e., the two terminals of the capacitors have roughly the same signal amplitude and sign). Therefore, the group delay increase may be reduced. There may be situations where bootstrapping the impedances (in this example, capacitors) is not necessary, in which case the inverters 231, 232 and switches SL1 and SL2 can be sized to provide gains other than a negative unity gain during the acquire/reset phase. Even in the case of a gain other than a negative unity, the latch core 230 may substantially reduce statistical offset.

Implementing the impedances 233 and 234 as resistors may reduce the statistical offset by partially auto-zeroing the offset of the latch core 230 during the acquire/reset phase. The same bootstrapping technique explained above can be used to reduce the loading caused by these resistors.

One disadvantage of using impedances 233 and 234 to couple the inverters 231 and 232 that make up the latch core 230 are that the impedances 233 and 234 load the latch core 230 and form a voltage divider between the output of one inverter (i.e., 231) and the input of the next inverter (i.e., 232). Therefore the effective gain of the inverter, as a result, the loop gain in the latch core 230 is reduced in the regeneration phase. These adverse effects increase the regeneration time constant and the response time of the latch core.

Figure 3:
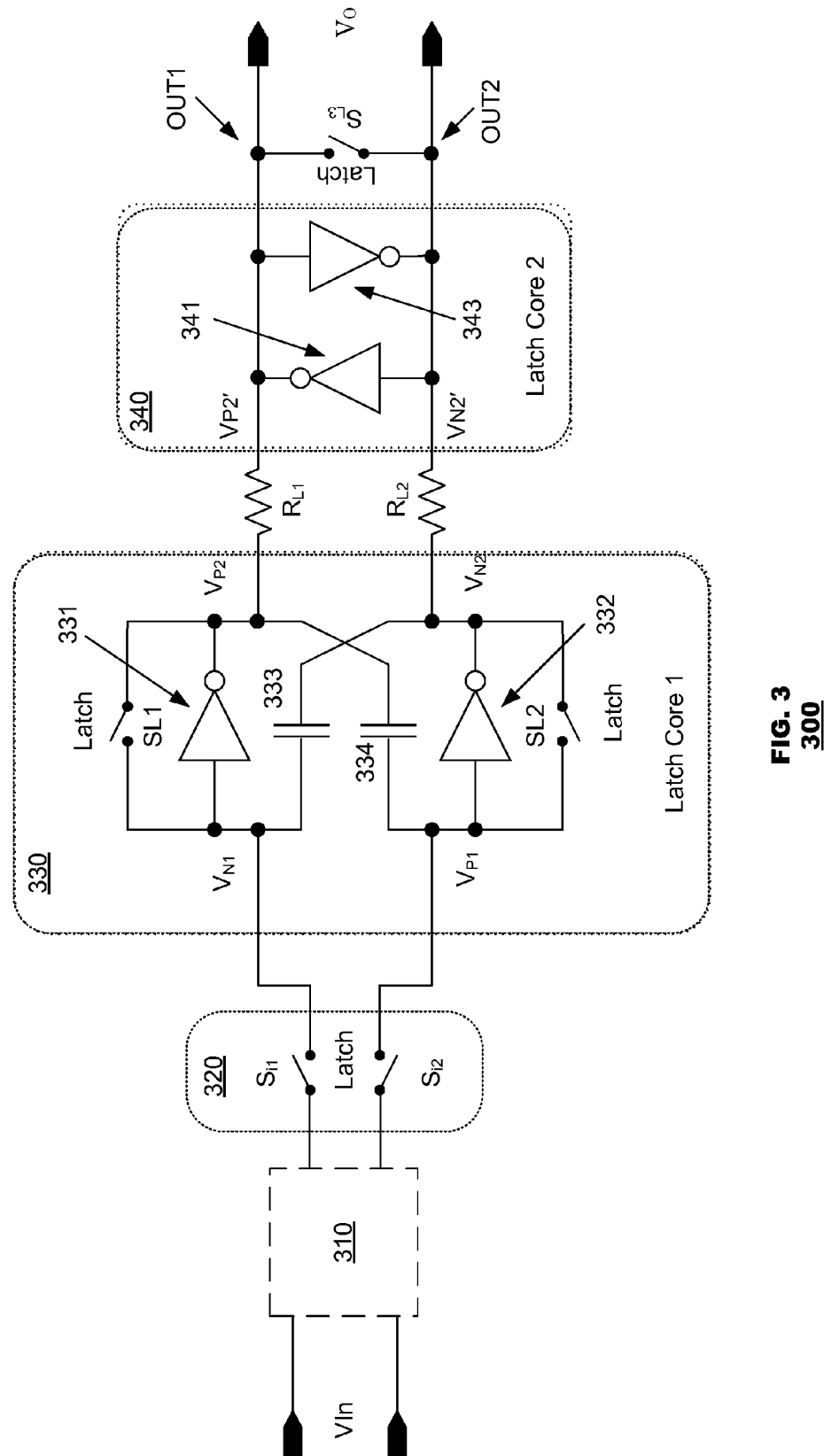
FIG. 3 illustrates another simplified schematic of a comparator according to an embodiment of the present invention.

To improve the regeneration time constant of the comparator 200, another latch can be incorporated into its design. FIG. 3 illustrates another simplified schematic of a comparator 300 according to an embodiment of the present invention. As shown in FIG. 3, the comparator 300 may include an isolation switch stage 320, a first latch core 330, load resistors RL1 and RL2, a second latch core 340, and a latch reset switch SL3. The load resistors RL1 and RL2 may be other forms of impedances, such as transistors, or capacitors.

A pre-amplifier stage 310 (shown in phantom) may connect to the comparator 300, and may include any type of (voltage or current) input buffer. The pre-amplifier stage 310 may be just a resistive or capacitive connection (an impedance) between its input and output, a voltage amplifier, current amplifier, transresistance amplifier or transconductance amplifier. The preamplifier stage 310 may provide some representation of the difference between two input signals, or a single input signal compared to a reference signal.

The isolation switch stage 320 and the first latch core 330 may be substantially the same as the comparator 200 shown in FIG. 2. However, comparator 300 may differ from comparator 200 in that the respective outputs of the first latch core 330 may be connected to respective first terminals of load resistors RL1 and RL2. The second terminals of the load resistors RL1 and RL2 may be connected to the respective inputs of the second (following) latch core 340. The outputs of the second latch core 340 may be connected to the outputs OUT1 and OUT2 of the comparator 300. Connected across the outputs of the comparator 300 may be the latch reset switch SL3. A first terminal of latch reset switch SL3 may be connected to a first output terminal OUT1 and a second terminal of latch reset switch SL3 may be connected to a second output terminal OUT2.

The configuration of the second latch core 340 may include inverters 341 and 343 connected in parallel, but at opposite polarity (cross coupled). For example, an input of inverter 341 may be connected via load resistor RL2 to the VN2 output of the first latch core 330, and may have an output connected via latch resistor RL1 to the VP2 output of first latch core 330. Conversely, an input of inverter 343 may be connected via load resistor RL1 to the VP2 output of the first latch core 330, and may have an output connected via load resistor RL2 to the VN2 output of the first latch core 330. The output signals may be output at terminals OUT1 and OUT2, respectively.

For the sake of brevity, the operation of comparator 300 will be described from the output of first latch core 330. The operation of first latch core 330 is similar to the operation of latch core 230 of FIG. 2. In FIG. 3, the impedances 333 and 334 are shown as capacitors, but may instead be resistors, transistors, or the like. The comparator 300 may also have 2 distinct operation phases, acquire/reset phase and latch/regeneration phase. The operation of the input buffer 310, isolation switches 320 and first latch core 330 are substantially similar to the operation of the comparator 200. The second latch core 340 may be connected to the output of the first latch core 330 through load resistors RL1 and RL2 to improve the regeneration time constant, reduce the response time and increase the sensitivity of the comparator 300. For example, in this configuration, the comparator 300 can resolve a smaller input signal in a given time. During the acquire/reset phase, a closed latch switch SL3 may reset the latch core 340 and short the comparator 330 outputs. The load resistors RL1 and RL2 on the output side are shorted by the latch switch SL3. The load resistors RL1 and RL2 may act like a load for the inverters 331 and 332 of the latch core 330. The configuration of inverter 331, latch switch SL1 and load resistor RL1 form an inverting amplifier. The same condition applies to the inverter 332, latch switch SL2 and load resistor RL2. To bootstrap the capacitances, or impedances 333 and 334, the gain of the amplifier formed by inverter 331, latch switch SL1 and load resistor RL1 (and inverter 332, latch switch SL2 and load resistor RL2) may be designed to be negative unity gain (−1) during the acquire/reset phase. The latch core 330 may auto zero its statistical offset by sampling its trip point on to the coupling capacitors 333 and 334. If these capacitors are replaced by other impedances, the latch core 330 may partially auto-zero its statistical offset or the statistical offset may reduce because of the isolation between the inverters 331 and 332 provided by the impedances 333 and 334.

The statistical offset of the second latch core 340 may not be auto-zeroed (i.e., substantially reduced to zero). However, the statistical offset of the latch core 340 may be attenuated by the transconductance ratios of the latch core 340 and latch core 330 when it is referred to the input of the latch core 330. Therefore, the comparator 300 may have a larger input referred offset compared to the comparator 200. However, the second latch core 340 incorporated into the comparator 300 does not suffer the loading and attenuation introduced by the coupling capacitors 333 and 334 of the latch core 330. Therefore, the regeneration time constant, response time and sensitivity of the comparator 300 is better than the comparator 200.

Figure 4:
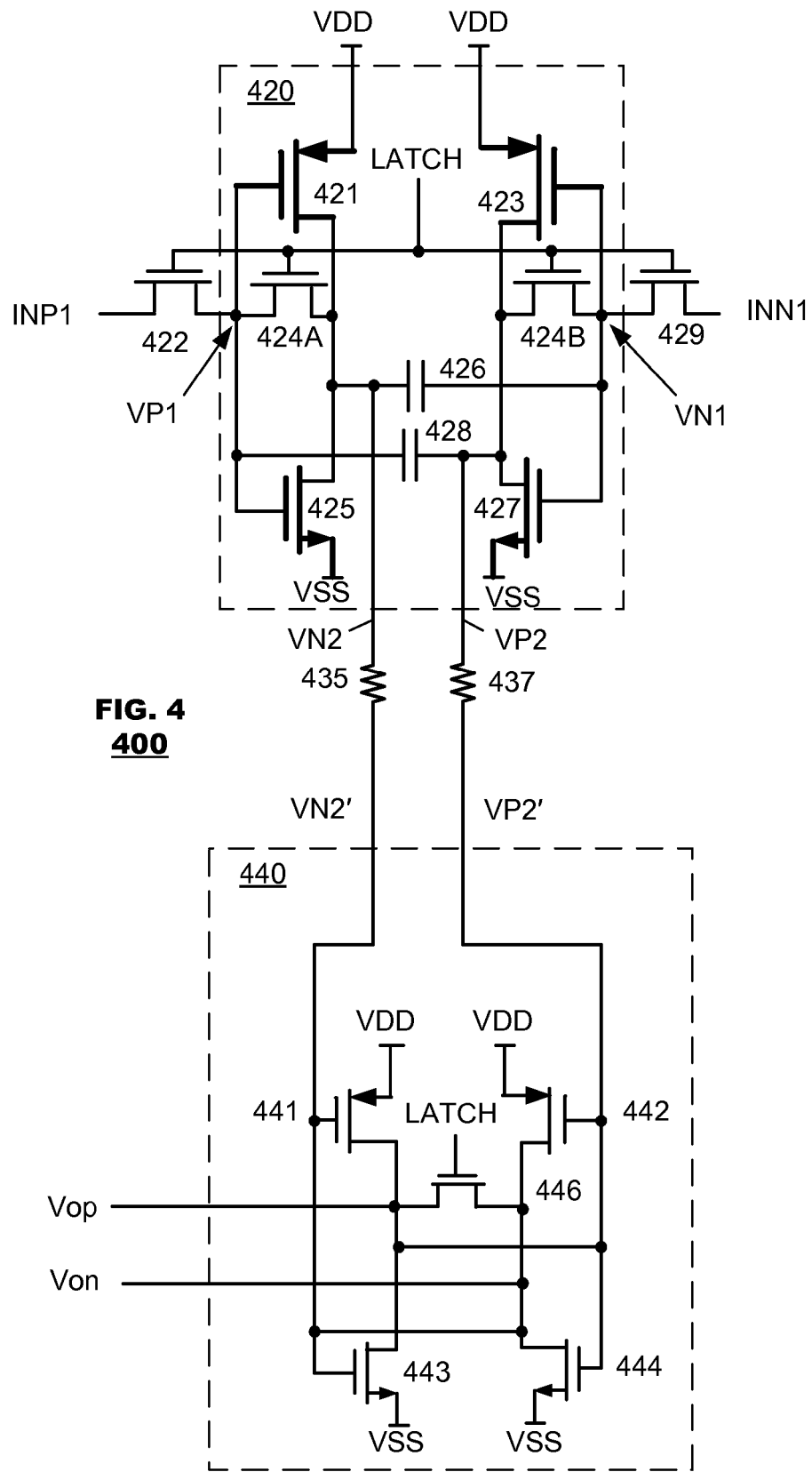
FIG. 4 illustrates an exemplary circuit diagram of a comparator according to an embodiment of the present invention.

FIG. 4 illustrates an exemplary schematic diagram of a comparator implementation of the embodiment described with respect to FIG. 3. Of course, other circuit implementations may be used to provide the functionality described with respect to FIG. 3. The comparator 400 may include a first latch core 420 with isolation switches, 422 and 429, load resistors 435 and 437, and a second (or following) latch core 440. The comparator 400 may receive its input signals directly or may be connected to a buffer that may be a resistive or capacitive voltage buffer (in case of a capacitive input coupling reset and acquire may be different from each other), a current buffer or some form of amplifier or attenuator, such as a pre-amplifier 310. Accordingly, the input signals to INN1 and INP1 may be provided directly by an analog signal device, generated by a voltage amplifier, current amplifier, resistive coupling, capacitive coupling or any similar type of circuitry. The input signals INP1 and INN1 may be applied to isolation switches 422 and 429.

The first latch core 420 may include PMOS transistors 421 and 423, latch transistors 424A and 424B, capacitors 426 and 428, and NMOS transistors 425 and 427. Alternatively, capacitors 426 and 428 may be resistors. The source terminals of transistors 421, 423 may be connected to a power supply voltage VDD. The drain terminals of transistors 421 and 423 may connect to the drain terminals of NMOS transistors 425 and 427. The gate terminals of transistors 421 and 423 may be connected to a drain terminal of respective isolation switches 422 and 429. Connected to the respective drain and gate terminals of transistors 421 and 423 may be the respective drain and source terminals of latch transistors 424A and 424B. The gate terminals of latch transistors 424A and 424B may be activated by the same latch signal that is applied to the gate terminals of isolation switches 422 and 429. The capacitors 426 and 428 may be arranged in a cross coupled configuration. For example, capacitor 426 may have a first terminal connected to a node between the respective gate terminals of transistors 423 and 427, and a second terminal connected to a node between the respective drain terminals of transistors 421 and 425. Conversely, capacitor 428 may have a first terminal connected to a node between the respective drain terminals of transistors 423 and 427, and a second terminal of the capacitor 428 may be connected to a node between the respective gates of transistors 421 and 425. The source terminals of transistors 425 and 427 may be connected to the lower supply voltage VSS (which may be ground).

A first output of the first latch core 420 may connect to the same node that connects the second terminal of capacitor 426 and the drains of transistors 421 and 425. A second output of the first latch core 420 may connect to the same node as the first terminal of capacitor 428 and the drain terminals of transistors 423 and 427. The first latch core 420 output may connect to a first terminal of load resistor 435 and the second latch core 420 output may connect to a first terminal of load resistor 437.

A second terminal of load resistor 435 may connect to a first input of second latch core 440, and a second terminal of load resistor 437 may connect to a second input of second latch core 440.

The second latch core 440 may include inputs, outputs, PMOS transistors 441 and 442, latch transistor 446, and NMOS transistors 443 and 444. The first input of the second latch core 440 may connect to a gate terminal of transistor 441 and a gate terminal of transistor 443. A source terminal of transistor 441 may be connected to power supply voltage VDD. A drain terminal of transistor 441 may connect to a drain terminal of transistor 443. A source terminal of transistor 443 may connect to the lower supply voltage VSS (which may be ground). Similarly, the second input of second latch core 440 may connect to a gate terminal of transistor 442 and 444. A source terminal of transistor 442 may connect to power supply voltage VDD. A drain terminal of transistor 442 may connect to a drain terminal of transistor 444. A source terminal of transistor 444 may connect to the lower supply voltage VSS (which may be ground). Latch transistor 446 may have a drain terminal connected to a node that is commonly connected to the drains of transistors 441 and 443, and may have a source terminal connected to a node that is commonly connected to the drains of transistors 442 and 444. The gate terminal of latch transistor 446 may have a control signal LATCH applied to allow the latch transistor 446 to conduct, and thereby function as a switch. The control signal LATCH may be the same control signal that is applied to latch switches 424A and 424B as well as isolation switches 422 and 429. The commonly connected drain terminals of transistors 441 and 443 may be connected to commonly connected gate terminals 442 and 444. Similarly, the commonly connected drain terminals of transistors 442 and 444 may be connected to commonly connected gate terminals 441 and 443. A first output of second latch core 440 may be from a node formed by the commonly connected drain terminals of transistors 441 and 443. A second output of second latch core 440 may be from a node formed by the commonly connected drain terminals of transistors 442 and 444.

In general, the comparator 400 provides a digital representation of the analog input signals applied to inputs INN1 and INP1. The comparator 400 operates in two distinct phases: Reset/acquire and Latch/regeneration phase. The analog input signal may always be present at a terminal of isolation transistors 422 and 429. However, the applied signal is passed to the inputs of the latch core only during the reset/acquire phase. As explained with respect to FIG. 2 the latch core 420 auto-zeroes (substantially reduces) its statistical offset during the reset phase since the capacitors 426 and 428 isolate the two inverters that comprise the first latch core 420, thereby the inverters reset and sample their inputs (gate voltages) to their trip points. If the capacitors 426 and 428 are replaced with a generic impedance (such as resistors), the isolation between the inverters may not be as strong as using capacitors. However, even when using resistors, partial statistical offset auto-zeroing may happen which reduces the input referred statistical offset.

As mentioned above with respect to FIG. 3, the use of capacitors 426 and 428 may act to keep the drain currents of the inverters in the first latch core 420 isolated from one another during the acquire/reset phase during which the latch is reset to its trip point. At the end of the reset/acquire phase the latch switch opens and the inputs of the inverters sample the signal passed through the isolation switches, and the gate voltage that keeps the inverter at its trip point (i.e. auto-zeroes its offset.) In addition, the latch reset switches 424A and 424B may not have to provide a resistance sufficient to overcome a negative resistance of the latch core as in the case of latch core 440. This provides a benefit that the reset switch sizes can be independent of the latch core transistor sizes. Since the exemplary embodiment provides for independent sizing of the latch reset switches 424A and 424B, the latch reset switches 424A 424B may be designed to have a resistance that can be used to create an inverting amplifier from the latch switch 424A transistors 421 and 425, and load resistor 435 (first inverter) and another inverting amplifier from the latch switch 424B, transistors 423 and 427, and load resistor 437 (second inverter). Using these similar operating characteristics and the selection of a suitable latch reset switch (424A and 424B) resistance for each, inverters having an amplification of a negative unity gain (−1) may be created from transistors 425 and 421, and 427 and 423, respectively, when the latch reset switches 424A,424B and 446 are actuated (closed). With the output of each inverter having a negative unity gain (−1), the respective input and output voltages from the latch core 420 may be, for example, VN1=(−)VP1 and VN2=(−)VP2. The voltages VN1, VN2 and VP1, VP2 at each plate of the capacitors 426 and 428 may be maintained at substantially the same voltages such that the voltage difference across the capacitors 426 and 428 appears to be zero volts, and the current may be approximately zero. Accordingly, the capacitors 426 and 428 may not influence the group delay resulting from the first latch core 420, and may essentially seem as though they are not present. This condition effectively bootstraps the capacitors 426 and 428. Therefore, the loading of the capacitors 426 and 428 at the input of the first latch core 420 may be reduced substantially. One benefit of this condition is that, the group delay at the input of the first latch core 420 may be minimized. The gain of the inverters explained above may be designed to have a particular value to optimize the group delay of the signal at the input of the latch core 420.

Figure 5:
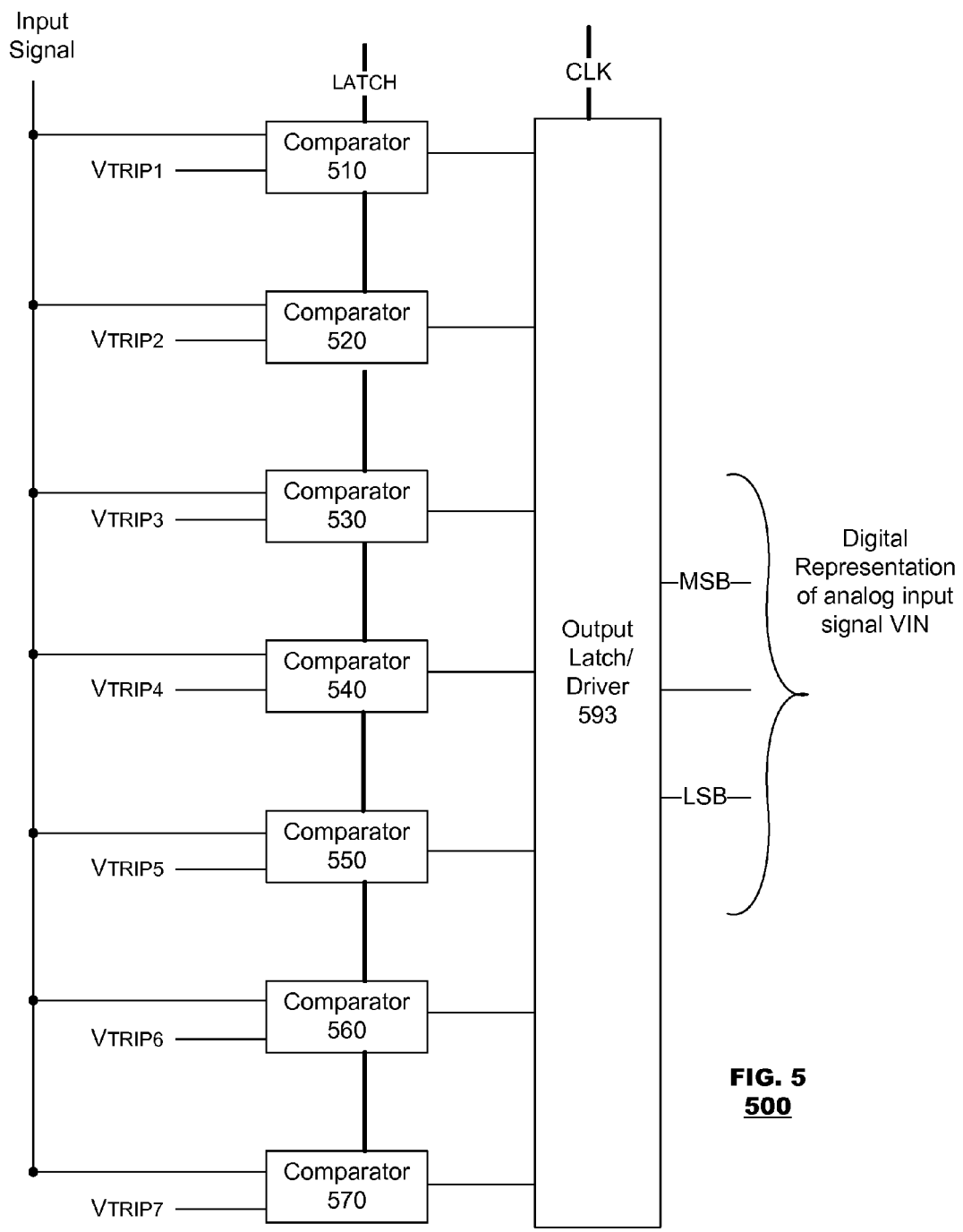
FIG. 5 illustrates an exemplary block diagram of an analog-to-digital converter according to an embodiment of the present invention.

FIG. 5 illustrates an exemplary block diagram of an analog-to-digital converter 500 according to an embodiment of the present invention. The analog-to-digital converter 500 may include an input for receiving an input signal VIN, a plurality of comparators 510-570, an output latch, and a plurality of inputs for reference voltage $V_{TRIP1}$-$V_{TRIP7}$. Alternatively, the reference voltages VTRIP1-VTRIP may be generated by the analog-to-digital converter 500. The analog-to-digital converter 500 may receive the analog input signal VIN at the respective input, may apply the reference voltages $V_{TRIP1}$-$V_{TRIP7}$ to the respective inputs of each of the comparators 510-570, and a control signal LATCH. The plurality of comparators 510-570 may include comparators such as comparators 200, 300 and 400 as described above with respect to FIGS. 2-4. As explained above, based on the comparison of the input signal VIN to each of the respective reference voltages $V_{TRIP1}$-$V_{TRIP7}$ by each of the comparators 510-570, the respective comparator 510-570 may output a signal representative of a single bit of a digital representation of the input analog signal. The output latch 593 may prioritize the signals received from the respective comparators 510-570. After a number of clock cycles, for example, the output latch 593 may output signals that are the digital representation of the input analog signal VIN. Although, shown as outputting a three (3) bit word, the number of comparators and ADC circuits may be any number as is suitable to generate an accurate digital representation of the input signal VIN. In addition to the flash ADC illustrated, other ADC configurations, such as pipelined ADC, folding ADC, sigma delta ADC and the like, implemented with the disclosed comparator embodiments may be envisioned by those of ordinary skill in the art.

Several features and aspects of the present invention have been illustrated and described in detail with reference to particular embodiments by way of example only, and not by way of limitation. Although, the embodiments of the disclosed comparators have been described using a high frequency input signal, the offset reducing capability of the disclosed embodiments may be used for any type of input signal with any frequency. Those of skill in the art will appreciate that alternative implementations and various modifications to the disclosed embodiments are within the scope and contemplation of the present disclosure.

We claim:

1. A high frequency input signal comparator for reducing group delay, minimizing statistical offset in the latch core, and minimizing frequency dependent offset, comprising:
    a pair of isolation switches;
    a latch core including a pair of latch switches;
    comparator outputs connected to outputs of the latch core for providing a digital representative of an input signal;
    wherein:
        the latch core samples the input signal, and includes a first inverter and a second inverter coupled directly to the pair of isolation switches, wherein an input of the first inverter is connected to a first terminal of a first capacitor and an output of the second inverter is connected to a second terminal of the first capacitor, and an input of the second inverter is connected to a second output of the comparator, and to a first terminal of a second capacitor, wherein a second terminal of the second capacitor is connected to the input of the first inverter;
        the pair of latch switches connects an inverter input to an inverter output of each respective inverter in the latch core; and
        a control signal controls the pair of isolation switches and the pair of latch switches such that in a first phase, the pair of isolation switches and the pair of latch switches are closed, and in a second phase immediately subsequent to the first phase, the pair of isolation switches and the pair of latch switches are open.

2. The high frequency input signal comparator of claim 1, further comprising:
    a pair of load resistors connected to a respective one of the first latch core outputs; and
    a following latch core connected to respective second terminals of a pair of load resistors; the following latch core including a first inverter and a second inverter, wherein the first inverter having an output connected to a first input to the following latch core and an input connected to a second input of the following latch core, wherein outputs of the following latch core are connected to the comparator outputs.

3. The high frequency input signal comparator of claim 2, further comprising:
    a final latch switch connected across the outputs of the following latch core, which is configured to short circuit a first of the following latch outputs to a second output of the following latch output, when actuated.

4. The high frequency input signal comparator of claim 1 wherein the pair of latch switches and the pair of isolation switches actuate in response to the same latch signal.

5. The high frequency input signal comparator of claim 1, wherein each of the first and second inverters is formed from a pair of transistors having commonly connected gate terminals and commonly connected drain terminals, wherein a first output of the pair of isolation switches is connected to the commonly connected gate terminals of a pair of transistors forming the first inverter through an isolation switch, and a second output of the preamplifier stage is connected to the commonly connected gate terminals of the pair of transistors forming the second inverter through another isolation switch.

6. The high frequency input signal comparator of claim 5, wherein the first capacitor is connected between the commonly connected drain terminals of a first pair of transistors of the first inverter and the commonly connected gate terminals of a second of the pair of transistors of the second inverter.

7. The high frequency input signal comparator of claim 5, wherein the second capacitor is connected between the commonly connected drain terminals of a second of the pair of transistors forming the second inverter and the commonly connected gate terminals of a first of the pair of transistors of the first inverter.

8. A comparator comprising:
    a pair of isolation switches operating on a common latch signal;
    a latch core including a pair of latch switches, the latch core sampling input signals and including a pair of inverters, a reset switch and a pair of cross-coupled impedances, wherein the pair of isolation switches, when open, isolates the latch core from the pre-amplifier stage; and
    latch core outputs;
    wherein:
        the latch core is connected directly to the pair of isolation switches; and
        the common latch signal controls the pair of isolation switches and the pair of latch switches such that both pairs of switches are in the same state at any given time.

9. The comparator of claim 8, the latch core comprising:
    a first comparator output connected to a first node between a first inverter of the pair of inverters and a first impedance of the pair of cross-coupled impedance and a second comparator output connected to a second node between a second inverter of the pair of inverters and a second impedance of the pair of cross-coupled impedance.

10. The comparator of claim 9, wherein the pair of cross-coupled impedances are capacitors.

11. The comparator of claim 9, wherein the pair of cross-coupled impedances are resistors.

12. The comparator of claim 9, wherein the pair of cross-coupled impedances are transistors.

13. The comparator of claim 8, further comprising:
    a first load impedance connected to a first latch core output;
    a second load impedance connected to a second latch core output; and
    a following latch core having a first input connected to the first load impedance and a second input connected to the second load impedance;
    wherein the following latch core has a first inverter having an input connected to the first load impedance and an output connected to the second load impedance, and a second inverter having an input connected to the second load impedance and an output connected to the first load impedance.

14. The comparator of claim 12, further comprising:
    a third latch reset switch may be connected in parallel to the first and second inverters.

15. An analog-to-digital converter (ADC), comprising:
    an ADC input for receiving an analog input signal;

a plurality of reference voltages having different voltage values;

a plurality of comparator circuits, wherein each respective comparator of the plurality of comparator circuits is connected to the ADC input and to one of the plurality of reference voltages;

wherein the plurality of comparator circuits comprise:
- a pair of isolation switches;
- a latch core including a pair of latch switches;
- comparator outputs connected to outputs of the latch core for providing a digital representation of the analog input signal;
- an output latch for outputting signals presenting the digital representation of the analog input signal;

wherein:
- the latch core samples the input signal, and includes a first inverter and a second inverter coupled directly to the pair of isolation switches, wherein an input of the first inverter is connected to a first terminal of a first capacitor and an output of the second inverter is connected to a second terminal of the first capacitor, and an input of the second inverter is connected to a second output of the comparator, and to a first terminal of a second capacitor, wherein a second terminal of the second capacitor is connected to the input of the first inverter;
- the pair of latch switches connects an inverter input to an inverter output of each respective inverter in the latch core; and
- a control signal controls the pair of isolation switches and the pair of latch switches such that in a first phase, the pair of isolation switches and the pair of latch switches are closed, and in a second phase immediately subsequent to the first phase, the pair of isolation switches and the pair of latch switches are open.

16. The analog-to-digital converter (ADC) of claim 15, further comprising:
- a pair of load impedances connected to a respective one of the first latch core outputs; and
- a following latch core connected to respective second terminals of a pair of load impedances, the following latch core including a first inverter and a second inverter, wherein the first inverter having an output connected to a first input to the following latch core and an input connected to a second input of the following latch core, wherein outputs of the following latch core are connected to the comparator outputs.

17. The analog-to-digital converter (ADC) of claim 15, further comprising:

a final latch switch connected across the comparator outputs, which is configured to short circuit a first of the comparator outputs to a second comparator output, when actuated.

18. The analog-to-digital converter (ADC) of claim 15, wherein the pair of latch switches and the pair of isolation switches actuate in response to the same latch signal.

19. The analog-to-digital converter (ADC) of claim 15, wherein each of the first and second inverters is formed from a pair of transistors having commonly connected gate terminals and commonly connected drain terminals, wherein a first output of the pair of isolation switches is connected to the commonly connected gate terminals of a pair of transistors forming the first inverter, and a second output of the pair of isolation switches is connected to the commonly connected gate terminals of the pair of transistors forming the second inverter.

20. The analog-to-digital converter (ADC) of claim 19, wherein the first impedance is a first capacitor and the second impedance is a second capacitor.

21. The analog-to-digital converter (ADC) of claim 20, wherein the first capacitor is connected between the commonly connected drain terminals of a first pair of transistors of the first inverter and the commonly connected gate terminals of a second of the pair of transistors of the second inverter.

22. The analog-to-digital converter (ADC) of claim 20, wherein the second capacitor is connected between the commonly connected drain terminals of a second of the pair of transistors forming the second inverter and the commonly connected gate terminals of a first of the pair of transistors of the first inverter.

23. The analog-to-digital converter (ADC) of claim 15, wherein the first impedance is a first capacitor and the second impedance is a second capacitor.

24. The high frequency input signal comparator of claim 2, wherein the group delay is reduced by sizing the pair of latch switches such that loading on a first node and a second node is minimized, and a gain from the first node to the second node is approximately −1, wherein:
- the first node is a connection between a first output of the pair of isolation switches, the input of the first inverter, and the first terminal of the first capacitor; and
- the second node is a connection between the output of the first inverter, and the first terminal of the second capacitor.

25. The high frequency input signal comparator of claim 1, wherein: in the first phase, the first and second inverters sample statistical offsets at each of their gates, substantially auto-zeroing the statistical offsets.

* * * * *

UNITED STATES PATENT AND TRADEMARK OFFICE
CERTIFICATE OF CORRECTION

PATENT NO. : 8,773,169 B2
APPLICATION NO. : 12/910662
DATED : July 8, 2014
INVENTOR(S) : Huseyin Dinc et al.

It is certified that error appears in the above-identified patent and that said Letters Patent is hereby corrected as shown below:

In the Specification

Column 11, line 30, change:

"an input of the second inverter" to --an output of the second inverter--;

Column 12, line 5, change:

"output of the preamplifier stage" to --output of the pair of isolation switches--;

Column 12, line 27, change:

"from the pre-amplifier stage" to --from a pre-amplifier stage--;

Column 13, line 22, change:

"an input of the second inverter" to --an output of the second inverter--.

Signed and Sealed this
Thirtieth Day of December, 2014

Michelle K. Lee
*Deputy Director of the United States Patent and Trademark Office*